(12) United States Patent
Cho et al.

(10) Patent No.: US 8,683,684 B2
(45) Date of Patent: Apr. 1, 2014

(54) METHOD OF MANUFACTURING COMPONENT EMBEDDED PRINTED CIRCUIT BOARD

(75) Inventors: Suk-Hyeon Cho, Suwon-si (KR);
Je-Gwang Yoo, Yongin-si (KR);
Byung-Moon Kim, Goyang-si (KR);
Han-Seo Cho, Daejeon (KR)

(73) Assignees: Samsung Electro-Mechanics Co., Ltd., Suwon (KR); Samsung Electronics Co., Ltd., Suwon-Si (KR)

( * ) Notice: Subject to any disclaimer, the term of this patent is extended or adjusted under 35 U.S.C. 154(b) by 108 days.

(21) Appl. No.: 13/200,920

(22) Filed: Oct. 5, 2011

(65) Prior Publication Data

US 2012/0030940 A1   Feb. 9, 2012

Related U.S. Application Data

(62) Division of application No. 11/896,769, filed on Sep. 5, 2007, now Pat. No. 8,064,217.

(30) Foreign Application Priority Data

Sep. 5, 2006 (KR) .......................... 10-2006-0085248

(51) Int. Cl.
*H05K 3/30* (2006.01)

(52) U.S. Cl.
USPC ................. 29/832; 29/846; 29/852; 174/252; 174/260; 257/676; 257/E25.032; 361/717; 361/760; 361/783; 438/65; 438/27

(58) Field of Classification Search
USPC ................. 29/832, 846, 852, 853, 849, 841; 174/255, 260, 252; 257/680, 676, 257/E25.032; 361/717, 718, 719, 760, 761, 361/783; 438/65, 69, 27, 29, 31
See application file for complete search history.

(56) References Cited

U.S. PATENT DOCUMENTS

| | | | |
|---|---|---|---|
| 5,907,477 A | 5/1999 | Tuttle et al. | |
| 6,821,804 B2 | 11/2004 | Thibeault et al. | |
| 6,921,183 B2 | 7/2005 | Yang et al. | |
| 6,921,922 B2 | 7/2005 | Kobinata et al. | |
| 7,055,987 B2 | 6/2006 | Staufert | |
| 7,400,035 B2 * | 7/2008 | Abe et al. ...................... | 257/700 |

(Continued)

FOREIGN PATENT DOCUMENTS

| | | |
|---|---|---|
| CN | 1466782 A | 1/2004 |
| CN | 1669374 A | 9/2005 |
| CN | 1776288 A | 5/2006 |
| KR | 10-2005-0071793 | 7/2005 |

OTHER PUBLICATIONS

Korean Office Action issued Sep. 18, 2007 in corresponding Korean Patent Application No. 10-2005-0071793.

(Continued)

*Primary Examiner* — Peter DungBa Vo
*Assistant Examiner* — Jeffrey T Carley

(57) ABSTRACT

A method of manufacturing an optical component embedded printed circuit board, the method including: stacking a first insulation layer on one side of a metal core; embedding an optical component in a cavity formed in the metal core; stacking a second insulation layer of a transparent material on the other side of the metal core; and forming a circuit pattern on the first insulation layer, the circuit pattern electrically connected with the optical component.

7 Claims, 6 Drawing Sheets

(56) References Cited

U.S. PATENT DOCUMENTS

| | | | |
|---|---|---|---|
| 2003/0160256 A1* | 8/2003 | Durocher et al. | 257/88 |
| 2004/0222433 A1* | 11/2004 | Mazzochette et al. | 257/99 |
| 2005/0133808 A1 | 6/2005 | Uraya et al. | |
| 2009/0154176 A1 | 6/2009 | Matsuoka et al. | |
| 2009/0260866 A1 | 10/2009 | Palm et al. | |

OTHER PUBLICATIONS

Chinese Office Action issued Mar. 27, 2009 and issued in corresponding Chines Patent Application No. 200710149517.1.

U.S. Patent Restriction Requirement, mailed Jul. 24, 2009, issued in corresponding U.S. Appl. No. 11/896,769.

U.S. Patent Office Action, mailed Dec. 2, 2009, issued in corresponding U.S. Appl. No. 11/896,769.

U.S. Patent Office Action, mailed Jul. 13, 2010, issued in corresponding U.S. Appl. No. 11/896,769.

U.S. Patent Final Office Action, mailed Feb. 16, 2011, issued in corresponding U.S. Appl. No. 11/896,769.

U.S. Patent Notice of Allowance, mailed Jul. 19, 2011, issued in corresponding U.S. Appl. No. 11/896,769.

U.S. Appl. No. 11/896,769, filed Sep. 25, 2007, Suk-Hyeon Cho et al., Samsung Electro-Mechanics Co., Ltd.

* cited by examiner

METHOD OF MANUFACTURING COMPONENT EMBEDDED PRINTED CIRCUIT BOARD

CROSS-REFERENCE TO RELATED APPLICATIONS

This application is a U.S. divisional application filed under 37 CFR 1.53(b) claiming priority benefit of U.S. Ser. No. 11/896,769 filed in the United States on Sep. 5, 2007 now U.S. Pat. No. 8,064,217, which claims earlier priority benefit to Korean Patent Application No. 10-2006-0085248 filed with the Korean Intellectual Property Office on Sep. 5, 2006 the disclosures of which are incorporated herein by reference.

BACKGROUND

1. Field

The present invention relates to a printed circuit board, more particularly to an optical component embedded printed circuit board.

2. Description of the Related Art

A market currently receiving the spotlight is the market for optical components, such as LED's and image sensors, etc. Here, products with high luminance are required for LED's, and products with high resolution are required for image sensors.

In the conventional LEF packaging technology, after a part is inserted, the heat generated is released mainly through a lead frame, which is structured to be in electrical contact on the board by way of solder.

SUMMARY

An aspect of the invention is to provide a technology for embedding an optical component in a printed circuit board and an optical component embedded printed circuit board, which allow increased heat release efficiency, especially when embedding an LED.

One aspect of the invention provides an optical component embedded printed circuit board that includes a metal core in which at least one cavity is formed, an optical component embedded in the cavity, a first insulation layer stacked on one side of the metal core, a second insulation layer, made of transparent material, stacked on the other side of the metal core, and a circuit pattern which is formed on the first insulation layer and which is electrically connected with the optical component.

The optical component may be an LED, in which case at least a portion of the second insulation layer over the LED may have a curved surface about the LED or may have roughness. This may be to diffuse the light emitted from the LED.

A via may be formed in the first insulation layer that provides thermal connection between the metal core and the circuit pattern. The heat inside may be released to the outside through the via.

In the case that the optical component is an image sensor, an infrared filter layer may further be stacked on the second insulation layer.

The second insulation layer may also have a circuit pattern formed thereon.

Another aspect of the invention provides a method of manufacturing an optical component embedded printed circuit board. The method includes stacking a first insulation layer on one side of a metal core, embedding an optical component in a cavity formed in the metal core, stacking a second insulation layer of a transparent material on the other side of the metal core, and forming a circuit pattern, electrically connected with the optical component, on the first insulation layer.

Before stacking the first insulation layer, an operation may further be included of forming a plating layer on one side of the metal core at a position where the optical component is to be embedded. The plating layer may allow a better contacting ability with respect to the optical component.

After stacking the first insulation layer and before embedding the optical component, an operation may be included of removing a portion of the metal core to form the cavity. Also, the cavity may be formed before stacking the first insulation layer. The cavity is a portion where the optical component may be embedded.

Forming the circuit pattern may further include forming a via which thermally connects the metal core with the circuit pattern. The via may be filled with a material high in thermal conductivity.

Yet another aspect of the invention provides a method of manufacturing an optical component embedded printed circuit board, which includes forming a plating layer on a portion of one side of a copper clad laminate; attaching a first photosensitive film, having a size corresponding to a size of an optical component, on one side of the copper clad laminate; plating the copper clad laminate and removing the first photosensitive film to form a cavity; removing a copper foil inside the cavity to expose a first insulation layer of the copper clad laminate and removing a copper foil on the other side of the copper clad laminate to form a circuit pattern; and embedding the optical component to be in electrical connection with the plating layer and stacking a transparent second insulation layer on one side of the copper clad laminate.

An operation of forming a hole in the other side of the copper clad laminate such that a copper foil on one side of the copper clad laminate is exposed may further be included between forming the plating layer and attaching the first photosensitive film, in which case plating the copper clad laminate and removing the first photosensitive film to form the cavity may further include plating the inside of the hole to form a via.

Additional aspects and advantages of the present invention will be set forth in part in the description which follows, and in part will be obvious from the description, or may be learned by practice of the invention.

DESCRIPTION OF EMBODIMENTS

Figure 1:
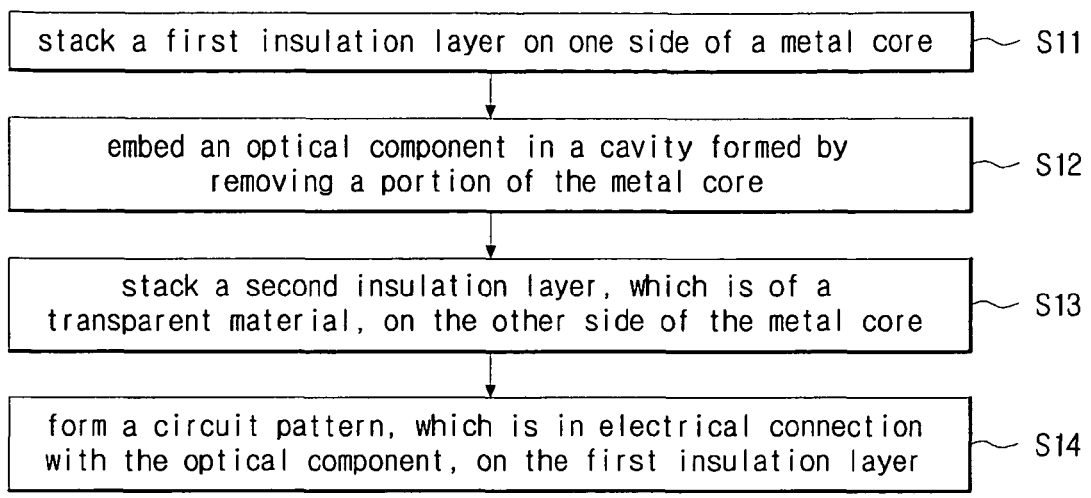
FIG. 1 is a flowchart for manufacturing an optical component embedded printed circuit board according to a first disclosed embodiment of the invention.

Certain embodiments of the invention will be described below in more detail with reference to the accompanying drawings, in which those components are rendered the same reference numeral that are the same or are in correspondence, regardless of the figure number, and redundant explanations are omitted.

Figure 2:
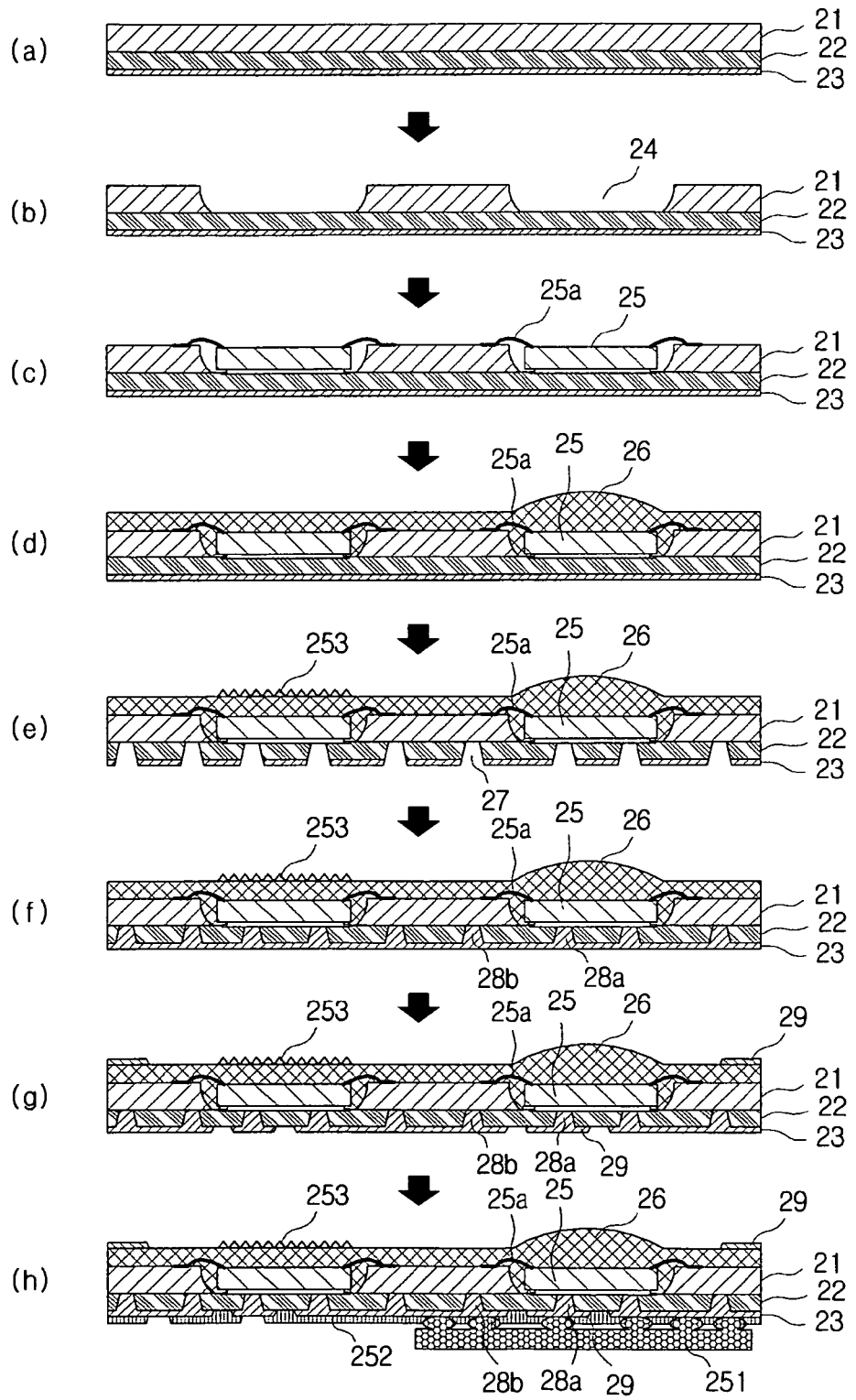
FIG. 2 is a process diagram for manufacturing an optical component embedded printed circuit board according to a first disclosed embodiment of the invention.

FIG. 1 is a flowchart for manufacturing an optical component embedded printed circuit board according to a first disclosed embodiment of the invention, and FIG. 2 is a process diagram for manufacturing an optical component embedded printed circuit board according to the first disclosed embodiment of the invention. In FIG. 2 are illustrated a metal core 21, a first insulation layer 22, a copper foil 23, cavities 24, optical components 25, wires 25a, a second insulation layer 26, holes 27, vias 28a, 28b, circuit patterns 29, an external component 251, resist 252, and roughness 253.

Operation S11 of FIG. 1 may include stacking the first insulation layer 22 on one side of the metal core 21, where drawing (a) of FIG. 2 represents a corresponding process. A material having a good heat releasing effect may be used for the metal core 21. Aluminum is commonly used, but other metals, including copper, may be used just as well. The first insulation layer 22 may be stacked on one side of the metal core 21, and as in (a) of FIG. 2, a copper foil 23 may be stacked in addition.

Operation S12 of FIG. 1 may include embedding the optical components 25 in the cavity 24 formed by removing portions of the metal core 21, where drawings (b) and (c) of FIG. 2 represent corresponding processes. Forming the cavities 24 in the metal core 21 may be performed before operation S11. That is, the first insulation layer 22 may be stacked after the cavities 24 are formed. In this case, it is possible to form the cavities 24 using a mechanical method. On the other hand, after the first insulation layer 22 is stacked on the metal core 21, the cavities 24 may be formed by chemical etching.

The optical components 25 may be embedded in the cavities 24. Examples of optical components 25 include LED's and image sensors. The optical component 25 may be electrically connected by wires 25a with the exterior, or may be coupled by flip chip type mounting. As the metal core 21 is of a conductive material, wires 25a may be connected, as in (c) of FIG. 2, to transfer electrical signals to the exterior.

Operation S13 of FIG. 1 may include stacking the second insulation layer 26, which is of a transparent material, on the other side of the metal core 21, where drawing (d) of FIG. 2 represents a corresponding process. The optical component 25 may emit light to the exterior or may receive light from the exterior. Therefore, it may be advantageous that the material used for the second insulation layer 26 stacked over the optical component 25 be a transparent material. Here, a "transparent material" not only refers to materials having a light transmissivity of 100%, but also encompasses semi-transparent materials. The second insulation layer 26 positioned over an optical component 25 may be formed as a convexly curved surface. If the optical component 25 is an LED, the convexly curved surface serves to diffuse the light. For a similar effect, roughness 253 may be formed on the surface of the second insulation layer 26. Conversely, if the optical component 25 is an image sensor, the second insulation layer 26 may have a flat shape. In this case, it may be advantageous to additionally stack an infrared filter layer over the second insulation layer 26.

Operation S14 of FIG. 1 may include forming a circuit pattern 29 that electrically connects the optical components 25 to the first insulation layer 22, where drawings (e), (f), and (g) of FIG. 2 represent corresponding processes.

In order to electrically connect the circuit pattern 29 with the optical components 25, vias 28a, 28b may first be formed. After forming holes 27, as shown in (e) of FIG. 2, the vias 28a, 28b may be formed by plating. The vias 28a may be electrically connected with an optical components 25. Furthermore, the vias 28b may also be thermally connected with the metal core 21, to release the heat within the printed circuit board to the outside. Here, to be "thermally connected" means that the heat of the metal core 21 may be released by conduction through the vias 28b to the exterior.

Drawing (g) of FIG. 2 is a representation after forming the circuit pattern 29, which may be formed by stacking a photosensitive film, performing exposure and development, and then by etching. As this subtractive process is a common process, it will not be discussed in further detail. While FIG. 2 represents the circuit pattern 29 formed only on the surface of the first insulation layer 22, it may also be formed on the second insulation layer 26, as long as it does not obstruct the path of light transferred to the optical components 25. After the circuit pattern 29 is formed, resist 252 may be coated, and the external component 251 may be mounted on the surface. As such mounting of the external component 251 is a common process, it will not be discussed in further detail.

Figure 3:
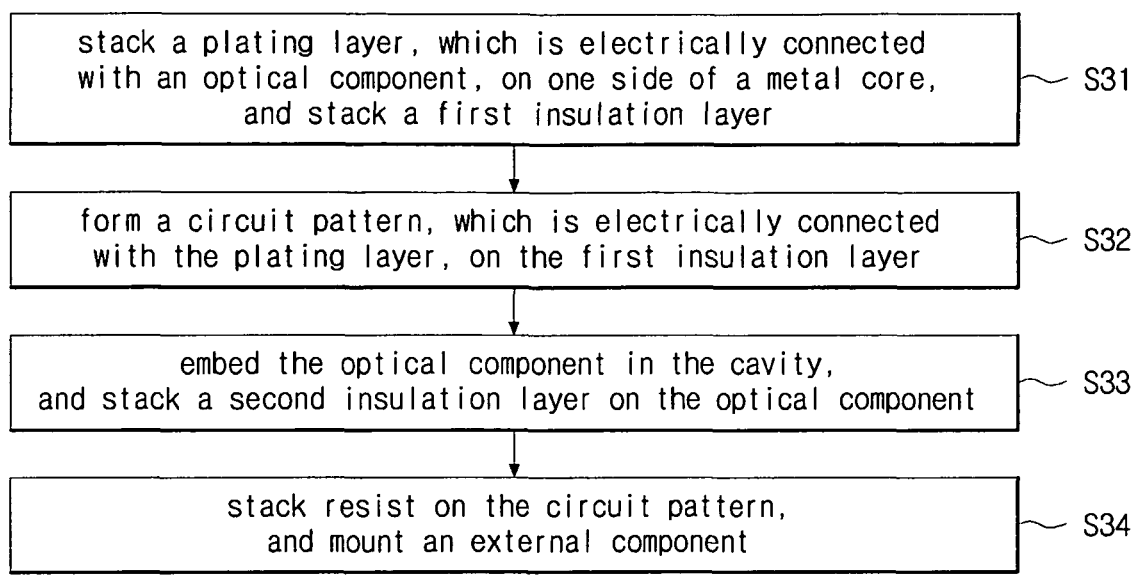
FIG. 3 is a flowchart for manufacturing an optical component embedded printed circuit board according to a second disclosed embodiment of the invention.
Figure 4:
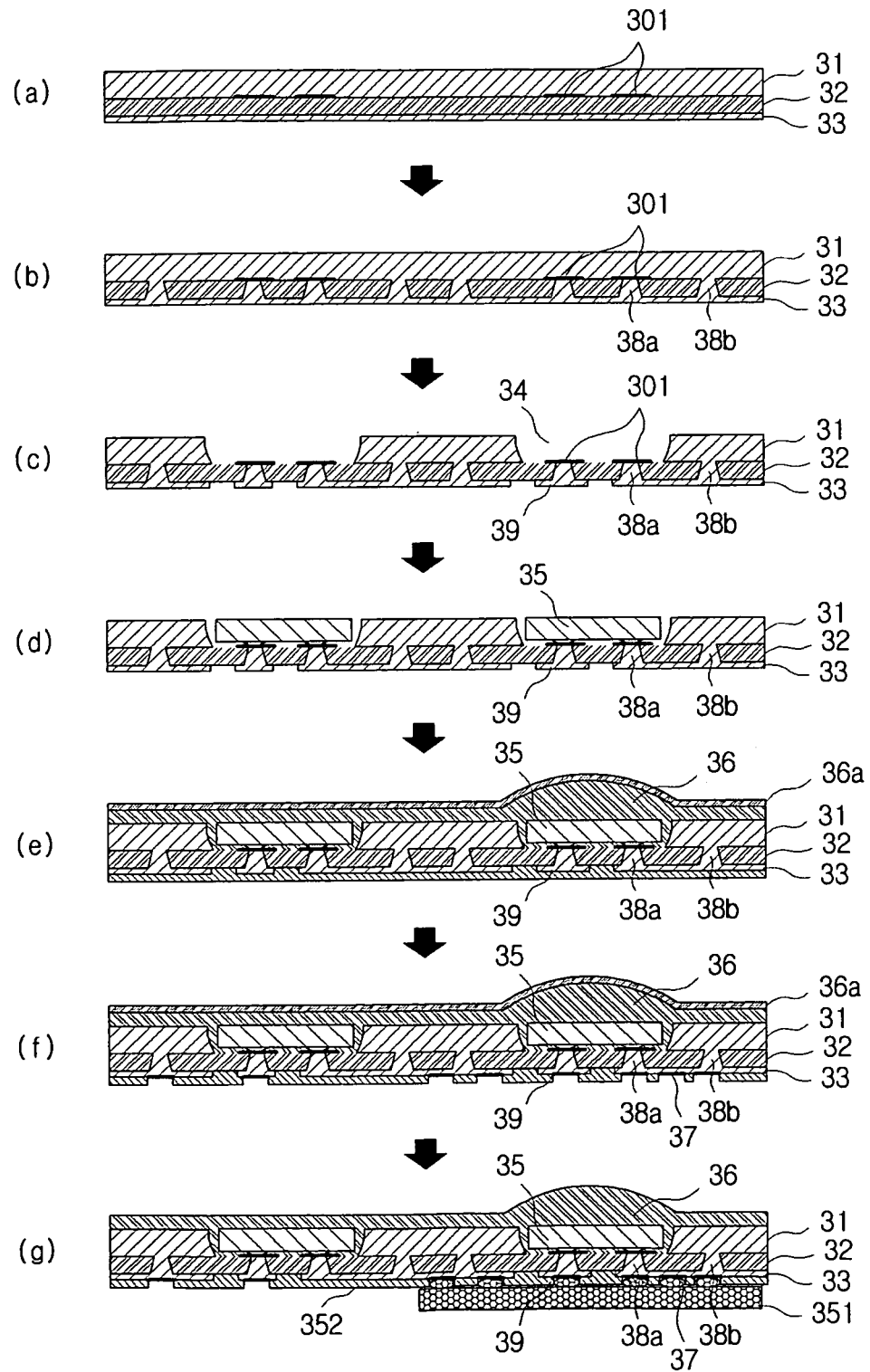
FIG. 4 is a process diagram for manufacturing an optical component embedded printed circuit board according to a second disclosed embodiment of the invention.

FIG. 3 is a flowchart for manufacturing an optical component embedded printed circuit board according to a second disclosed embodiment of the invention, and FIG. 4 is a process diagram for manufacturing an optical component embedded printed circuit board according to the second disclosed embodiment of the invention. In FIG. 4 are illustrated a metal core 31, a first insulation layer 32, a copper foil 33, cavities 34, optical components 35, a second insulation layer 36, vias 38a, 38b, a plating layer 301, an external component 351, and resist 352.

Operation S31 of FIG. 3 may include stacking a plating layer 301 on one side of the metal core 31 that is electrically connected with the optical components 35, and stacking the first insulation layer 32, where drawing (a) of FIG. 4 represents a corresponding process. The plating layer 301 may be the portions where the optical components 35 may subsequently be connected electrically. Thus, the plating may be performed in consideration of the positions where the optical components 35 will be mounted. While gold may commonly be used for the plating layer 301, the invention is not thus limited, and any metal may be used as long as it is a material that is not removed by an etchant. The first insulation layer 32 may be stacked in the direction in which the plating layer 301 is formed. The copper foil 33 may be stacked additionally on the first insulation layer 32.

Operation S32 of FIG. 3 may include forming a circuit pattern 39 on the first insulation layer 32 that is electrically connected with the plating layer 301, and removing portions of the metal core 31 to form cavities 34 in the portions where the optical components 35 will be embedded, where drawings (b) and (c) of FIG. 4 represent corresponding processes. In order to electrically connect the plating layer 301 with the circuit pattern 39 which will be subsequently formed, vias 38a, 38b may be formed, as in (b) of FIG. 4. The method of forming the vias 38a, 38b may include forming holes by a mechanical method, such as of using a laser, and filling the insides with a conductive metal, such as by electroless plating and electroplating, etc.

Drawing (c) of FIG. 4 represents removing portions of the metal core 31 to form the cavities 34 in which to embed the optical components 35. After stacking resist on the metal core 31, only the portions where the cavities 34 will be formed may be opened. After a subsequent etching process, the cavities 34 may be formed. Here, if the plating layer 301 is a metal, such as gold, it may not be removed by the etchant, and may remain as is, so that the vias 28a beneath the plating layer 301 may also be protected by the plating layer 301 and not be removed by the etchant. In contrast, the metal core 31 inside the cavities 34 may be removed, whereby the first insulation layer 32 may be exposed to the exterior. When removing the metal core 31, the copper foil 33 may be removed as well, to form the circuit pattern 39.

Operation S33 of FIG. 3 may include embedding the optical components 35 in the cavities 34 and stacking the second insulation layer 36 over the optical components 35. When stacking the second insulation layer 36, using a film layer 36a, as in (e) of FIG. 4, may offer an insulation layer 36 having a flatter surface. That is, the film layer 36a may be stacked on the second insulation layer 36 while it is interposed between the second insulation layer 36 and the press. The film layer 36a may allow the press and the second insulation layer 36 to be separated more easily.

Operation S34 of FIG. 3 may include stacking resist 352 on the circuit pattern 39 and mounting the external component 351. This is a common process, and thus will not be discussed in further detail.

Figure 5:
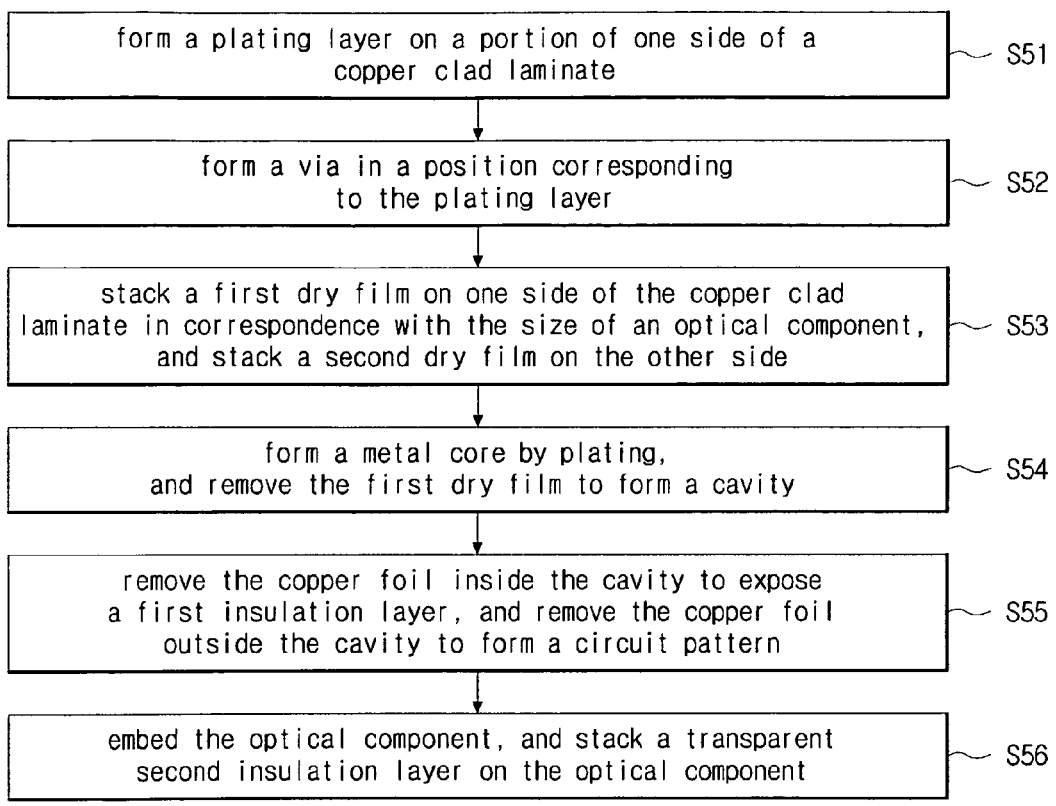
FIG. 5 is a flowchart for manufacturing an optical component embedded printed circuit board according to a third disclosed embodiment of the invention.
Figure 6:
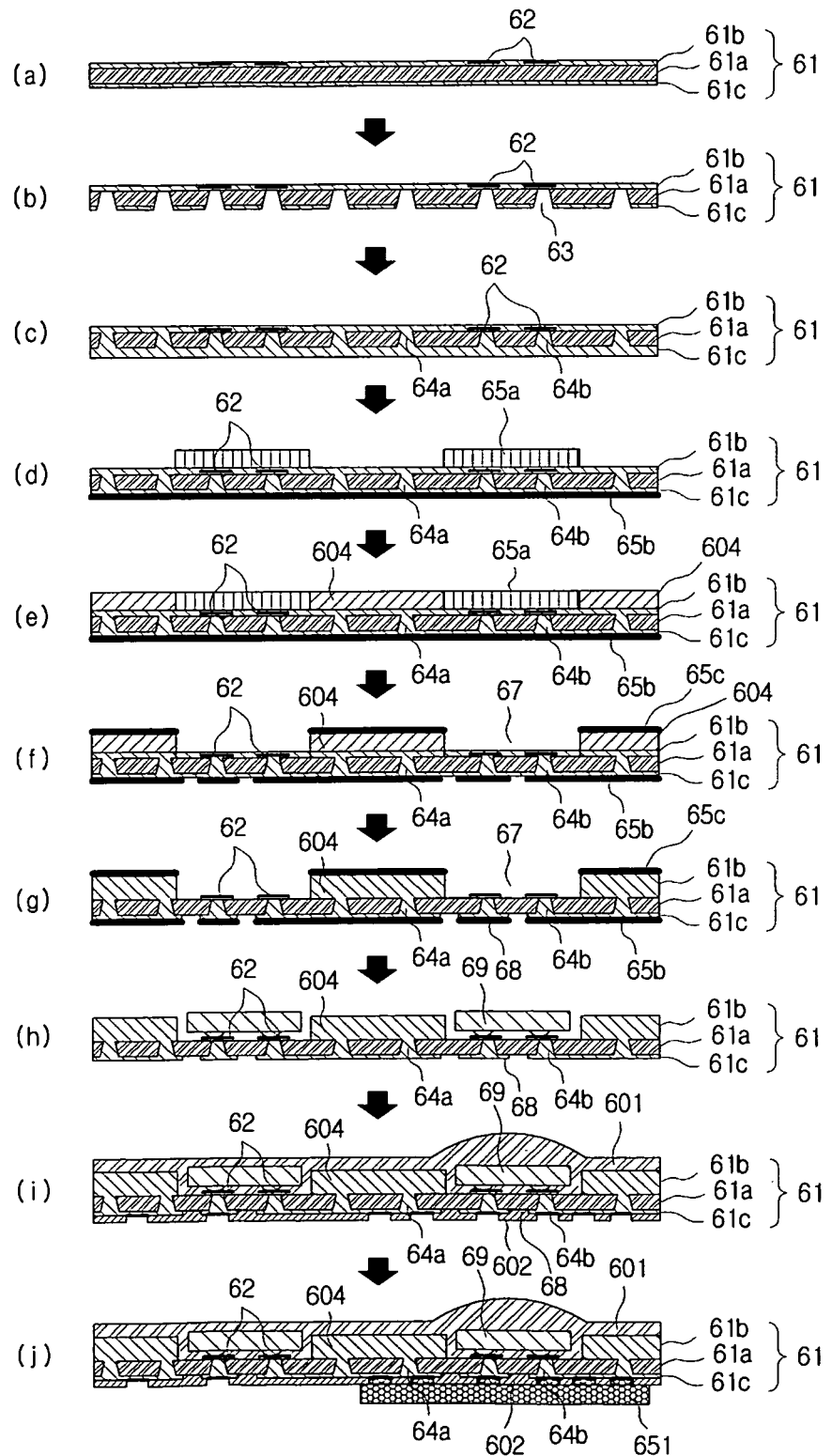
FIG. 6 is a process diagram for manufacturing an optical component embedded printed circuit board according to a third disclosed embodiment of the invention.

FIG. 5 is a flowchart for manufacturing an optical component embedded printed circuit board according to a third disclosed embodiment of the invention, and FIG. 6 is a process diagram for manufacturing an optical component embedded printed circuit board according to the third disclosed embodiment of the invention. In FIG. 6 are illustrated a copper clad laminate 61, a first insulation layer 61a, copper foils 61b, 61c, a plating layer 62, holes 63, vias 64a, 64b, a first photosensitive film 65a, a second photosensitive film 65b, a third photosensitive film 65c, cavities 67, a circuit pattern 68, optical components 69, a second insulation layer 601, resist 602, and an external component 651.

Operation S51 of FIG. 5 may include forming the plating layer 62 on a portion of one side of the copper clad laminate 61, where drawing (a) of FIG. 6 represents a corresponding process. The copper clad laminate 61, which has copper foils 61b, 61c stacked on either side of the first insulation layer 61a, is an electrical material that is commonly used. The plating layer 62 may be formed on one side of the copper clad laminate 61, which will electrically connected with the optical components 69. The plating layer 62 may improve the connection to bumps or studs formed on the pads of the optical components 69.

Operation S52 of FIG. 5 may include forming vias 64a, 64b in positions corresponding to the plating layer 62, where drawings (b) and (c) of FIG. 6 represent the corresponding processes. A laser may be used to form the holes 63, and a plating process may be performed to form the vias 64a, 64b. The vias 64a, 64b may provide electrical connection between the copper foils 61b, 61c. In particular, some of the vias 64b may be formed in positions that correspond with the plating layer 62, so as to electrically connect the optical components 69 and circuit pattern 68 later. Also, vias 64a that are connected with the metal core 604 formed in (e) of FIG. 6 serve to maximize the heat releasing effect. The copper foils 61b, 61c represented in (a) of FIG. 6 may be given increased thicknesses after the plating process, to be given the forms illustrated in (c) of FIG. 6.

Operation S53 of FIG. 5 may include stacking a first dry film 65a on one side of the copper clad laminate 61 in correspondence with the size of the optical components 69 and stacking a second dry film 65b on the other side, where drawing (d) of FIG. 6 represents a corresponding process. Because of the subsequent plating process, the space occupied by the first dry film 65a may become the cavities 67 in which the optical components 69 will be mounted.

Operation S54 of FIG. 5 may include forming the metal core 604 by plating, and removing the first dry film 65a to form the cavities 67, where drawings (e) and (f) of FIG. 6 represent corresponding processes. The space formed after removing the first dry film 65a may become the cavities 67, in which the optical components 69 will be mounted. Thus, the first dry film 65a may be formed with sizes that are in correspondence to the sizes of the optical components 69, that is, with sizes that are slightly larger than the sizes of the optical components 69.

When a plating process is performed after (d) of FIG. 6, a metal core 604 may be formed such as that in (e) of FIG. 6. Additionally stacking a third dry film 65c in the direction where the first dry film 65a has been removed, and opening the third dry film 65c stacked over the cavities 67 for the subsequent etching process, results in a configuration as shown in (f) of FIG. 6.

In the case of the present embodiment, unlike the embodiments illustrated in FIGS. 2 and 4, since the cavities 67 are not formed by etching, the boundaries between the cavities 67 and the metal core 604 are vertical, and the minimal amount of space is obtained in which to embed the optical components 69.

Operation S55 of FIG. 5 may include removing the copper foil 61b inside the cavities 67 to expose the first insulation layer 61a, and removing the copper foil 61c outside the cavities 67 to form the circuit pattern 68, where drawing (g) of FIG. 6 represents a corresponding process. When the first dry film 65a is removed, the copper foil 61b inside the cavities 67 may be exposed, as shown in (f) of FIG. 6. Thus, the copper foil 61b may be removed by etching, in order to block the flow of electricity between the metal core 604 and the optical components 69. The plating layer 62 may not be removed by the etchant. Here, by opening the second dry film 65b and etching the copper foil 61c outside the cavities 67 at the same time the copper foil 61b inside the cavities 67 are etched, the circuit pattern 68 may be formed. The third dry film 65c may serve to protect portions of the metal core 604 besides the cavities 67.

Operation S56 of FIG. 5 may include embedding the optical components 69 and stacking a transparent second insulation layer 601 on the optical components 69, with the subsequent processes including stacking resist 602 on the circuit pattern 68 and mounting the external component 651. These are in correspondence with drawings (h), (i), and (j) of FIG. 6. Operation S56 is similar to the processes described with reference to FIGS. 2 and 4, and thus will not be discussed in further detail.

According to certain aspects of the invention as set forth above, the number of effective processes can be minimized when embedding components, so that process costs can be reduced.

Also, when embedding components, one layer of circuit can be given a buried form. Thus, the overall thickness of the printed circuit board can be decreased, and the stiffness can be increased.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing an optical component embedded printed circuit board, the method comprising:

stacking a first insulation layer on a first surface of a metal core;

embedding an optical component in a cavity formed in the metal core, the first insulation layer having at least a first region exposed by the cavity and a second region being in contact with the metal core;

stacking a second insulation layer of a transparent material on a second surface of the metal core opposite to the first surface; and forming a circuit pattern on the first insulation layer, the circuit pattern electrically connected with the optical component, the forming the circuit pattern comprising forming a via in the second region of the first insulation layer to thermally connect the metal core with the circuit pattern.

2. The method of claim 1, further comprising, between stacking the first insulation layer and embedding the optical component:

removing a portion of the metal core to form the cavity.

3. The method of claim 1, further comprising, before stacking the first insulation layer:

forming a plating layer on one side of the metal core at a position where the optical component is to be embedded.

4. The method of claim 3, further comprising, between stacking the first insulation layer and embedding the optical component:

removing a portion of the metal core to form the cavity.

5. The method of claim 1, further comprising, before stacking the first insulation layer:

removing a portion of the metal core to form the cavity.

6. The method of claim 1, further comprising, after forming the circuit pattern:

forming a circuit pattern on the second insulation layer.

7. The method of claim 1, wherein forming the circuit pattern further comprises: forming another via in the first region of the first insulation layer to contact the optical component with the circuit pattern.

* * * * *